United States Patent [19]

Berger et al.

[11] Patent Number: 5,376,505
[45] Date of Patent: Dec. 27, 1994

[54] DEVICE FABRICATION ENTAILING SUBMICRON IMAGING

[75] Inventors: Steven D. Berger, Chatham, N.J.; William DeVore, Hayward, Calif.

[73] Assignee: AT&T Corp., Murray, N.J.

[21] Appl. No.: 852,272

[22] Filed: Mar. 16, 1992

[51] Int. Cl.$^5$ .............................................. G03F 9/00
[52] U.S. Cl. ........................................ 430/296; 430/4; 430/5; 430/311; 430/396; 430/494
[58] Field of Search ................... 430/296, 4, 311, 396, 430/494, 5

[56] References Cited

U.S. PATENT DOCUMENTS 5,079,112  1/1992  Berger et al. ..................... 430/296

OTHER PUBLICATIONS

CA 104 (2):13081t to Iwamatsu, Jan. 13, 1986, "Patterning by electron-beam lithography and-ion beam etching."
M. Lepselter et al, *VLSI Electronics Microstructure Science*, ed. Norman G. Einspruch, Academic Press, pp. 108-114, 1981.
M. B. Heritage, *J. Vac. Sci. Technol.*, vol. 12, No. 6, Nov./Dec. 1975.
Takayuki Asai, *Japanese Journal of Applied Physics*, vol. 19 (1980), Supp. 19-1, pp. 47-50, "1:4 Demagnifying Electron Projection System".
H. W. Koops and J. Grob, "X-ray Microscopy", *Springer Series in Optical Sciences*, vol. 43, G. Schmahl and D. Rudolph, eds. (1984).
M. D. Levinson et al, "Improving Resolution in Photo-lithography with a Phase-Shifting Mask", *IEEE Transaction on Electron Devices*, vol. ED-29, No. 12, (Dec. 1982).

*Primary Examiner*—John Kight, III
*Assistant Examiner*—P. Hampton-Hightower
*Attorney, Agent, or Firm*—George S. Indig

[57] ABSTRACT

Fabrication of 0.25 gm design rule or smaller devices on chips, that may attain levels of 256 megabit or higher depends upon lithographic patterning by use of accelerated charged particle beams. Fabrication is expedited by acceleration values resulting in deBroglie wavelengths at least in order of magnitude smaller than such design rule to permit cost saving both in fabricating apparatus and resulting devices. Most importantly, such wavelength values permit significant variation in spatial angle of incidence of beam to wafer to permit both large instantaneous exposure areas and in temporal angle of incidence to expedite beam scanning as emitted from a fixed particle source.

12 Claims, 2 Drawing Sheets

DEVICE FABRICATION ENTAILING SUBMICRON IMAGING

BACKGROUND OF THE INVENTION

1. Technical Field

The invention is concerned with a fabrication of devices best exemplified by Large Scale Integrated circuits built to submicron design rules, e.g. equal to or less than 0.5 μm. Relevant fabrication entails projection lithography using charged particle delineating energy—either electron or ion.

2. Terminology

It is useful to consider specific usage of certain terms in the context of the disclosure.

Optical Field—defines the field area—depending upon context, either for mask or wafer—corresponding with extreme values of angle of incidence of delineating rays (generally for delineating electron rays). It sometimes refers to maximum field permitting needed edge-to-edge resolution. It more generally refers to the actual area resulting from electronic beam scanning,—in one system, to the area electronically scanned before mechanical repositioning of mask or wafer to initiate the next electronic scanning step.

Scanning—as unmodified, refers to movement of the delineating particle beam under the influence of an applied field of varying magnitude. It does not refer to mechanical movement, e.g. of wafer or mask stage, which may be described as "mechanical scanning", "mechanical movement", etc. deBroglie Wavelength—has relevant implications descriptive of the related property for electromagnetic radiation. It is defined as follows:

$$\lambda = h/P$$

in which
 $\lambda$ = deBroglie Wavelength
 h = Planck's constant = $6.6 \times 10^{-27}$ erg-sec
 p = momentum = mass × velocity Note: Description is generally in terms of electrons as operating in vacuum. Accordingly, accelerating field energy (e.g. ~50–200 kV) is imparted to result in similarly energized electrons (e.g. to result in 50–200 keV electrons). While there is some increase in effective mass of the electrons due to relativistic influence, this is largely ignored for purpose of this description.

Transfer of the same energy to ions results in smaller deBroglie wavelength. Since wavelength varies inversely as the square root of particle mass, increasing mass, e.g. by 1800×—the mass relationship for a proton relative to an electron—results in a $\lambda$ value which is approximately 1/42.5 of that of an electron at the same kinetic energy.

DESCRIPTION OF THE PRIOR ART

Considerable effort worldwide is directed to generations of LSI of design rules (minimum feature size and/or spacing dimension) smaller than the ~1.0–0.9 μm design rule, and of chip size larger than the ~1 cm², which characterize current production. It is expected that the present ~1 Mbit chip will yield, in succession, to 4, 16, 64 Mbit—with decreasing design rule and increasing chip size playing approximately equal roles (e.g. decrease in design rule and increase in chip dimension, each by a factor of $\sqrt{2}$, together yielding twice the number of circuit elements in each of the x and y directions, to result in the anticipated, generation-by-generation, quadrupling of chip capacity).

The inventive teaching is directly concerned with design rule as limited by lithographic patterning. Presently used UV lithography—at this time in the "near-UV" spectrum ($\lambda \sim 365$ nm in present fabrication) will serve for somewhat smaller design rules—perhaps as aided by phase masking. (See, M. D. Levinson, et al, *IEEE Transaction on Electron Devices* "Improving Resolution in Photolithography with a Phase-Shifting Mask", vol. ED-29, No. 12, Dec. 1982.) Radiation in the "deep-UV" spectrum ($\lambda = 350$ nm to 150 nm) is expected to serve for fabrication of devices at design rules of 0.5 μm and smaller—possibly to ~0.35 μm (expected to permit attainment of the 64 Mbit level chip).

For still smaller design rules, it is believed it will be necessary, to pattern with delineating energy of shorter wavelength. Emergence of suitable short wavelength delineation may result in displacement of longer wavelength for somewhat larger design rules as well—perhaps for 0.5 μm or larger. Impetus may be improved device yield due to improved tolerance to non-ideal conditions as based on shorter wavelength itself, or as resulting from associated advances.

Initial and continuing effort makes use of electromagnetic energy of required shorter wavelength—of energy in the x-ray spectrum. A variety of problems have been addressed with some substantial success. Lens problems, to large extent due to limitations in refractive index in otherwise desirable materials, have led to emphasis on reflective optics. Reflectivities of suitable magnitude have been realized by use of multiple layered mirrors—by use of Distributed Bragg Reflectors. Distortions and aberrations of complex origin have led to a variety of scanning modes. A prominent source of distortion for projected images is due to variation in magnification with distance from the optic axis. Co-pending U.S. patent application 595,341, filed Oct. 10, 1990, depends upon ringfield scanning to accommodate this problem. In that approach, the completed pattern or pattern segment is produced by means of a narrow scanning arcuate slit of curvature defined by constant radial spacing from the optic axis.

Possibility of accelerated electron illumination in lieu of electromagnetic illumination for mask pattern delineation has not been overlooked. Transfer of the fundamental technology from electron microscopy to primary pattern delineation has resulted in the world-dominant approach to mask generation, as exemplified by the Electron Beam Exposure System. (See, M. Lepselter et al, *VLSI Electronics Microstructure Science*, ed. Norman G. Einspruch, Academic Press, pp. 108–114, 1981.) The same primary pattern generation has been used for direct beam writing of LSI patterns. This history has provoked studies directed to electron mask delineation.

*J. Vac. Sci. Technol.*, vol. 12, No. 6, November/December 1975 describes one such effort by M. B. Heritage. As there reported, a 10× reduction projection system used an electron beam-illuminated foil mask with considerable success. Provision for parallel ray illumination over the mask area, together with equipment complexity/size to maintain aberrations at a tolerable level, were, however, quite costly.

Adaptation of scanning in electron masking is often ascribed to Takayuki Asai and co-workers. Their work is described in *Japanese Journal of Applied Physics*, vol.

19 (1980), Supplement 19-1, pp. 47-50, "1:4 Demagnifying Electron Projection System". They made use of a metal foil mask which was scanned with parallel ray electron illumination. They reported resolution of about 0.2 μm.

Work by H. W. Koops and J. Grob as reported in "X-ray Microscopy", *Springer Series in Optical Sciences*, vol. 43, G. Schmahl and D. Rudolph, eds. (1984), is based on this form of parallel ray scanning, again using an absorbing mask. Like Asai et al, feasibility of sub-micron pattern delineation is clearly demonstrated. The main disadvantage of the approach is in terms of equipment complexity/size.

U.S. Pat. No. 5,079,112 issued Jan. 7, 1992, describes and claims integrated circuit fabrication also based on electron beam lithography. A key feature substitutes scatter-non-scatter for absorption-transparency masking—an approach suited to use of apertured as well as non-apertured masks. Discrimination, as between scattered and unscattered radiation, is due to an expediently dimensioned apertured scatter filter positioned in the vicinity of the ray crossover plane before the wafer—with aperture generally on the optical axis for systems now receiving attention. The 50–200 kV accelerating voltage range desired for resolution and feature spacing offers image contrast at the 80% level and higher. The process is known as Scattering with Angular Limitation in Projection Electron-beam Lithography.

SUMMARY OF THE INVENTION

The invention takes advantage of sub-micron charged particle pattern delineation capability shown by prior workers to be attainable by use of charged particle illumination. Apparatus simplification as well as size reduction and attendant improvement in yield are the consequence of small equivalent wavelength, in turn resulting in large depth of focus. Most important, realization of deBroglie wavelengths at least in order of magnitude smaller than intended sub-micron design rules of range including 0.1 μm and smaller, permits departure from the parallel ray illumination considered necessary by prior workers. The instantaneous area of the zone to be scanned is large—is tolerant of instantaneous variation in angle of incidence by at least 0.01° or larger as based on column height and other equipment dimensions. Temporal variation in angle of incidence during scanning may be at 0.1° or larger. Dynamic correction to accommodate such temporal variation when required is of reduced needed precision for the same reason.

In many respects, the inventive approach is of characteristics quite similar to that of reported work using parallel illumination. Accelerating voltages, studied experimentally, have been within the ~50–200 kV range as appropriately used in SCALPEL, to result in a deBroglie wavelength, λ, of 0.01 μm and smaller. Operation within this range virtually eliminates this parameter as prime limitation on resolution—on resolution at the submicron level to perhaps 0.1 μm design rule and smaller. It is expected that contemplated chips fabricated in accordance with the invention, may be at 256 Mbit and 1 gbit levels.

Fabrication in accordance with the invention depends upon patterning of the device-in-fabrication by use of a beam of charged particles containing patterning information imparted during transmission through a mask, as accompanied by stepwise or continuous scanning of the beam, to cumulatively produce the entire pattern. It is fundamental to the inventive teaching that patterning entails deliberate and determinable variation of angle of incidence with respect to the surface being patterned: (1) for a given region being exposed at any instant, angle of incidence varies spatially for extreme particle rays making up the beam relative to a reference ray position—e.g. by an amount of at least 0.01° or larger based on column height and/or other equipment dimensions and (2) beam movement, whether stepwise or continuous, is accompanied by angle of incidence which varies temporally, e.g. as measured at such reference ray position or in terms of average angle or beam axis angle—values for such temporal beam movement for designs under study, may be of 0.1° or larger. As such, the invention importantly contemplates departure from the parallel ray/orthogonal angle of incidence assumed by many to be characteristic of fabrication at contemplated sub-micron design rules. The approach, here referred to as "skew-scan" has important implications in terms of processing as well as apparatus. It capitalizes on advantages of particle delineation both in permitted use of a simple point source—as well as in elimination of lens elements required for assuring orthogonal angle of incidence, to permit reduction in apparatus cost and size. The same considerations ease requirements placed on processing precision to have implications in terms of improved device quality/yield.

Significant value derives from beam scanning as resulting from imposition of a magnetic and/or electrostatic field upon a beam which, in an important embodiment, may be regarded as emanating from an essentially fixed source position. In this instance, scanning is, at least in part, the direct consequence of changing direction of the emanating beam as induced by a deflection field of appropriate varying net size. Such a field may serve to assure registration/alignment, as well as to produce the ultimate pattern scanning, e.g. on a radiation-responsive resist coating of a wafer.

The inventive "skew-scan" approach helps to satisfy the precision demands which are increasingly aggravated as design rules decrease. In particular, lessening of radially-dependent lens system aberrations is realized by permitted assured passage of the beam through the system center independent of the mask region being imaged. The same advantageous improvement in control, as due to apparatus simplification—to avoidance of apparatus/processing required to redirect beam rays to assure orthogonal angle of incidence—may assure precision of beam position central to the aperture filter at the crossover (or image inversion) position required, e.g. for blocking unwanted scattered radiation attendant upon SCALPEL imaging.

Preferred embodiments of the invention depend upon process as well as apparatus considerations realizable with charged particle, rather than electromagnetic, patterning radiation. One of these is real-time (or dynamic) focusing, as permitted by electromagnetic lenses, e.g. for correcting for curvature of field. Another entails deflection in addition to that responsible for scanning—e.g. for assuredly satisfying precision requirements for "stitching" of adjacent pattern regions.

Scanning is necessarily area-limited. It can never extend beyond the "optical field" as defined above. At this time, optical field values for ~0.25 μm design rule may be of area ~1 cm$^2$ for equipment of size/complexity motivating the approach. For smaller chip size this field may avoid need for mechanical movement between scanning steps—each of which may be sufficient to pattern the entire chip. Contemplated increase in chip area as discussed, unless accompanied by advances resulting in increased optical field size, may dictate larger apparatus or mechanical movement between scanning steps during fabrication of an individual chip. Regardless of such considerations, it is expected that most economic fabrication will entail mechanical stage movement. Wafer area will likely continue to exceed optical field size. Mechanical movement will likely continue to be useful, at least on chip-to-chip basis.

Consistent with discussion thus far, the inventive approach is primarily directed to tolerance for varying angle of incidence, both spatially and temporally, as resulting during electronic scanning. While modes of the invention contemplate some mechanical movement of mask and/or wafer during this period, such movement is sufficiently slow relative to beam scan rate as to be disregarded under most circumstances. Nevertheless, in overall terms, mechanical movement, sometimes as supplemented by precise beam positioning by field interaction with the beam, may play a significant role. A primary function for such mechanical movement, whether stepwise or gradual, is to reposition mask relative to the wafer to initiate each electronic scanning step. In accordance with certain operating modes, mechanical movement may be tolerated during electronic scanning. In general, this mechanical movement is sufficiently slow as to be largely ignored in terms of electronic scanning.

A throughput advantage realizable by skew-scan takes the form of a now-permitted lens system design. Dynamic focusing is no longer necessarily practiced by adjustment of the cored, likely paired or "doublet", lenses responsible for primary focusing. Instead, this function may be performed using auxiliary, coreless lenses with timesaving resulting from elimination of inductive lag.

U.S. patent application, Ser. No. 814,953 filed Dec. 30, 1991, hereby incorporated by reference, contemplates use of a strut segmented mask to accommodate both small mask thickness and large pattern area, thereby expediting small design rule device fabrication. It is expected that early commercialization will entail use of such segmented masks together with the present skew-scan approach.

In general, the invention is advantageously practiced in terms of instantaneous exposure of the largest pattern area consistent with other considerations. Short deBroglie wavelength values, in yielding depth of focus to accommodate path length differences, e.g. as between the axial and extreme rays, permit large optical fields—permit instantaneous exposure and scanning of a region of considerable area. Operation may take the form of instantaneous exposure of such a segment, e.g. as strut supported, with scanning serving primarily to step from segment to segment. Dynamic focusing, may serve to vary focal length as needed—step-by-step or less frequently.

DETAILED DESCRIPTION

Introduction

Figure 1:
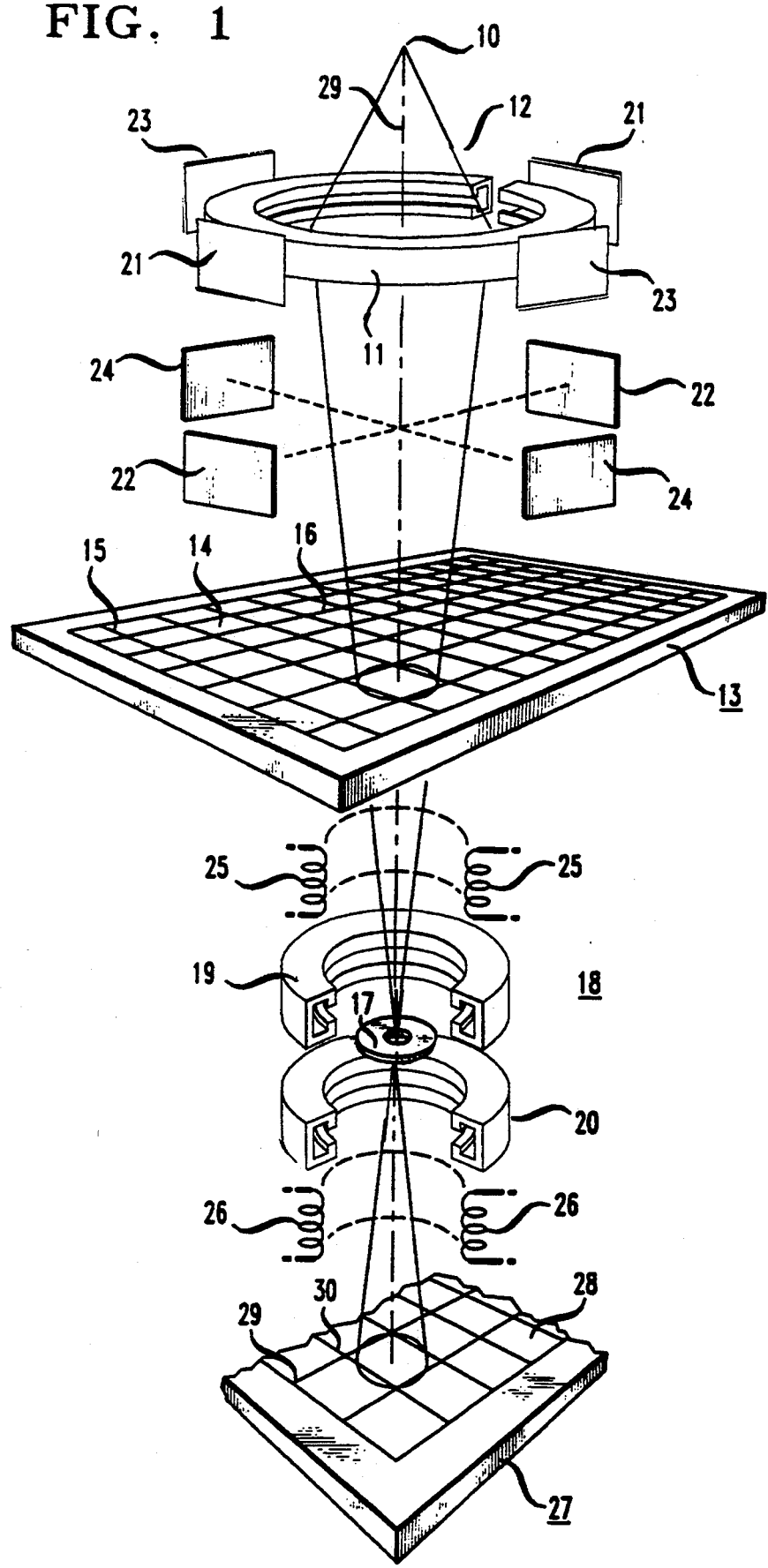
FIG. 1 is a diagrammatic view of illustrative skew-scan apparatus.

For ease of presentation, the invention is largely discussed in terms of electron patterning—primarily by use of scatter-non-scatter masking in accordance with the "SCALPEL" process (as described in U.S. Pat. No. 5,079,112, issued Jan. 7, 1992). The inventive teaching is equally applicable to ion patterning, likely dependent on transparency-absorption masking with attendant implications both in apparatus and processing. Other variations from specific description may be dictated. Detailed description of all such variations is not considered appropriate to the present disclosure.

Consistent with general expectation, description is in terms of a projection system dependent upon mask-to-wafer demagnification, perhaps of 4:1–5:1. Of course, the skew-scan approach is equally applicable to 1:1 as well as to other ratios. Magnification, while not receiving much present day attention, may profit by use of the inventive teaching as well.

The Drawing

Apparatus depicted in FIG. 1 includes a particle source 10 followed by a condenser lens 11 which operates on particle beam 12 to reduce cross-section as incident on mask 13. For illustrative purposes, mask 13 is shown as constituted of pattern regions 14. Such regions may correspond with strut-separated segments as in co-pending U.S. patent application, Ser. No. 07/814,953, filed Dec. 30, 1991, in which event interface lines 15 and 16 may be regarded as struts, likely with the embracing skirts, not shown, described in that case. Following modulation which imparts patterning information on the beam during passage through mask 13, the beam continues to converge, finally reaching a crossover (or image inversion) on or near the plane defined by aperture filter 17. As discussed, aperture filter 17 is usefully included for electron imaging deferred on scatter-non-scatter masking for blocking unwanted scattered radiation as in SCALPEL. It may serve in other systems in the same manner—e.g. by blocking unwanted feature-edge scattered radiation in systems dependent on absorption-transparency masking.

As elsewhere in the disclosure, little emphasis is placed on apparatus design features not directly relevant to the inventive teaching. As an example, the aperture filter 17, included for the primary purpose indicated, may define—may itself serve as—the numerical aperture of the system.

Cross-over is at the center of projector lens system 18 which, as depicted, consists of a doublet of two optically equivalent lenses 19 and 20. These lenses may be oppositely polarized to inherently cancel corresponding aberrations implicit to design or operation common to the two. (Consistent with usual practice, the hardware responsible for generation of the functional shaped field is, itself, referred to as the "lens".)

As depicted, scanning is the primary responsibility of paired deflectors 21 and 22 for x-direction scanning, and 23 and 24 for y-direction. Such deflector pairs may serve, too, for precise adjustment of beam position, to themselves, or together with other elements, assure registration/alignment. Shown schematically as rectangles, they likely consist of electromagnetic deflection coils, although they may be based on electrostatic deflection, or a combination of both, as well. In either event, design criteria are well-known—see, for example, Ludwig Reimer, "Transmission Electron Microscopy", *Springer Series in Optical Sciences*, vol. 36, pp. 19–49.

Dynamic correction for aberration as well as for focusing, e.g. correcting for wafer height variation as well as field curvature, is advantageously accomplished by coreless lenses 25 and 26. Assigning responsibility for dynamic adjustment to lenses 25 and 26 permits constant level powering of cored lenses 19 and 20 and speeds the process by lessening inductive lag time.

Upon emerging from projection lens system 18, the beam, now of increasing cross-section, is made incident on wafer 27. As shown, regions 28 designedly correspond in pattern content with mask regions 14. While conveniently depicted as approximately equal in size, they are likely smaller in conformity with now-contemplated mask-to-wafer demagnification, e.g. 4:1 to 5:1. (Lines 29 and 30, define regions 28, and in usual arrangement, have no physical embodiment.)

The system receiving experimental attention provides for mechanical scanning both of mask 13 and of wafer 27. For the system depicted—likely conforming with first commercialization—the first form of mechanical scanning may be continuous and opposite in direction for the two, and at rates accommodating demagnification, e.g. at 4:1 to 5:1 for mask and wafer, respectively. A second form of mechanical movement provides for fabrication in which a single mask pattern or region is stepped, to result in repeated exposure on the wafer. The objective may be satisfied by movement of mask or wafer alone or a combination of the two.

Design criteria for condenser and projector lenses and other parts of the system, e.g. including scan coils and deflectors, are at an advanced state of design as used, for example, in direct-write Electron Beam Exposure Systems as well as in electron microscopy. (See, for example, Ludwig Reimer, "Transmission Electron Microscopy", *Springer Series in Optical Sciences*, vol. 36, pp. 19–49, for design considerations appropriate to the inventive use.)

Reference is made to FIG. 1 in a general description of the inventive skew-scan operation. While the figure is suitable for this purpose, it does not depict a variety of elements familiar to the artisan and serving in actual operation. For example, dynamic aberration correction may entail additional deflectors compensating for errors resulting from equipment/process defects. Lens systems, too, are illustrative—may include additional elements.

Figure 2:
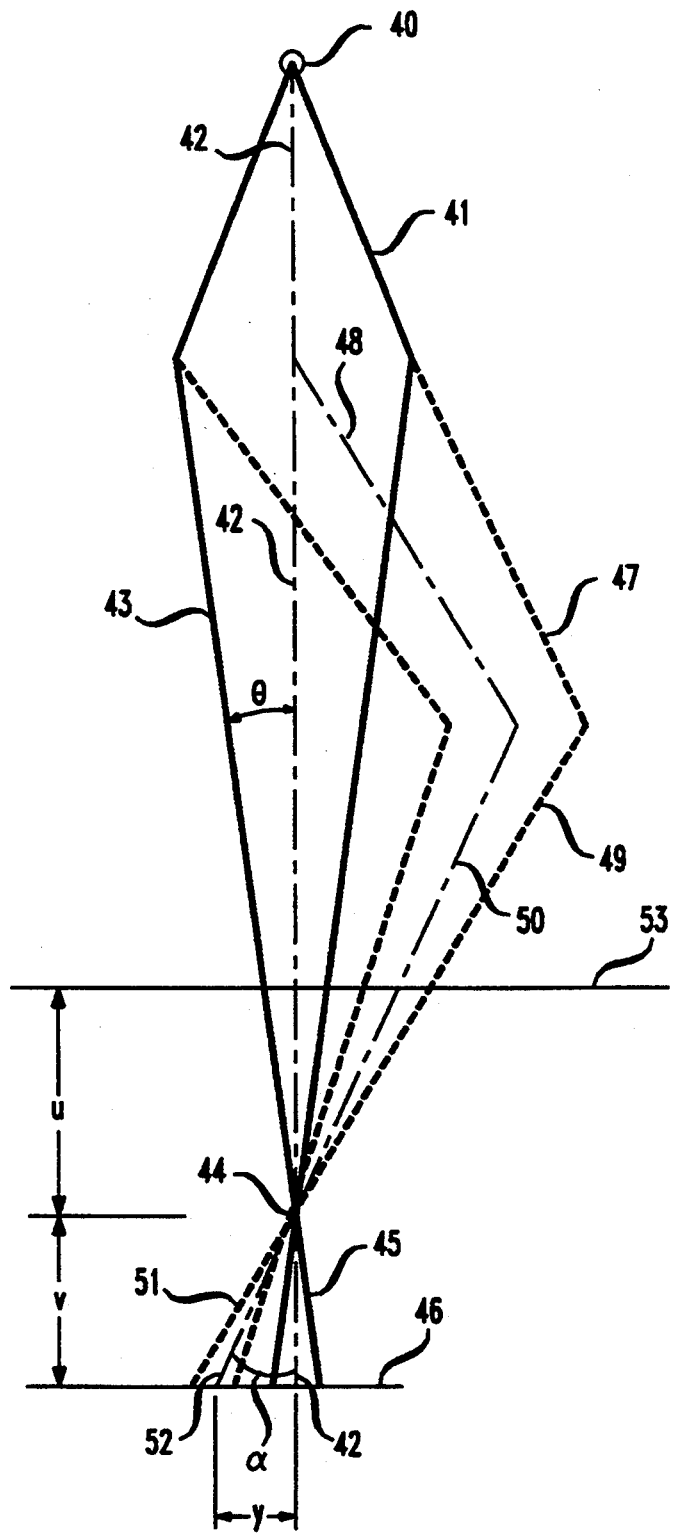
FIG. 2 is a ray diagram depicting a delineating beam in axial and extreme scan positions which may be regarded as showing either x- or y-direction scanning.

FIG. 2 is a ray diagram depicting a scanning beam as may be produced on the apparatus of FIG. 1. As shown, fixed-position source 40 emits a beam 41 centered about beam axis 42, in this instance corresponding with the optic axis. A condenser lens such as lens 11 of FIG. 1 causes convergence of the beam, which, as undeflected—as now denoted beam 43—remains axially directed along axis 42 in passage through mask 53. Convergence is such as to result in crossover at 44, e.g. within or in proximity to a scattering filter such as filter 17 of FIG. 1. The non-diverging beam 45 is focused on wafer surface 46. For the central position depicted, it is appropriate to depict beam 45 as centered about axis 42, although minor adjustment, e.g. for stitching precision, may result in some deviation in position.

This figure also shows the beam in its extreme scan position within one optical field. Now depicted by broken lines, such a beam 47, deflected e.g. by deflectors 21, 23 of FIG. 1, is shown centered about beam axis 48. Deflection by deflectors such as 22, 24 result in beam 49 centered about axis 50. Deflection is such as to assure crossover again at 44, e.g. within the center of an aperture filter such as filter 17 of FIG. 1 to result in beam 51 centered about axis 52, again coming to focus on wafer surface 46—again, with such deflection-adjustment as to assure proper positioning.

General

The inventive processes benefit by two attributes of charged particle delineation as afforded by electrons, e.g. by use of SCALPEL, as well as by ions. The first is the permitted reduction in wavelength—for electrons, to dimensions perhaps one or two orders of magnitude shorter than or competing electromagnetic delineation—far shorter for ions. (The comparison is for x-ray in the design rule regime of $\sim 0.25$ $\mu$m or smaller.) The second is the charged nature of the particles. Together they permit the non-normal incidence of delineating radiation with respect to the surface being patterned, and the facility for dynamically adjusting to assure registration/alignment as well as focusing.

Relaxation of demands related to depth of focus accommodates the varying ray path length corresponding with instantaneous delineation of a pattern region of significant area as operating from a fixed particle source—a source conveniently considered as a point source. For contemplated near-term design rules, perhaps down to 0.1 $\mu$m, accelerating fields within the $\sim 50$–$200$ kV voltage range for otherwise suitable apparatus design, instantaneously exposed areas may be of a few or several square millimeters, e.g. of 25 mm$^2$. Such areas may correspond with segment size, as otherwise dictated, for example, in accordance with one of the strut-supported mask approaches of the above-noted U.S. patent application. (The allusion, is to a square or, more generally, to a low aspect-ratio rectangular segment. The effectively one-dimensioned chip-length segment—the high aspect-ratio segment resulting from use of non-intersecting parallel struts—profits both from this invention and from that of the co-pending case as well.) Dynamic adjustment, as for positioning and focusing, expedites stepping/scanning both with regard to continuous mask patterns and to discontinuous patterns (e.g. strut/skirt separated patterns).

It is convenient to consider the above embodiment, particularly in terms of instantaneous overall segment exposure with dynamic adjustment for segment-to-segment stepping. Other considerations may lead to variations. Wavelength/design rules may permit stepping, at least as between adjacent segments, without focusing change—perhaps without positional adjustment. Circumstances may not require segment-by-segment focusing change. Experimentally established conditions resulting in optical field size of $\sim 1$ cm$^2$ (for particular design rules and apparatus) permit a significant number of segment-by-segment steps without refocusing.

A contemplated approach is based on ray scanning between or perhaps serving the function of stepping. A likely application is in patterning of the "one dimension", e.g. chip pattern length segment in which scanning may be, e.g. by means of a beam of sufficient width to instantaneously expose the entirety of the short dimension while scanning the long.

Discussion is largely in terms of exposure—likely cumulative exposure to pattern a complete chip before moving on to the next. Other considerations may dictate exposure to define a sequence of partial patterns—e.g. to define a corresponding fractional region for one or more of the entire repeating series of such patterns in one dimension across an entire wafer—as directly or indirectly followed by patterning of the adjacent fractional region, etc. Other conditions may be taken into account in determining detailed operation. For example, minimization of temperature differentials to reduce problems associated with mask or wafer distortion may be accomplished by such repeated partial area exposures of individual instantaneously exposed regions.

For the most part, beam scanning has been discussed in terms of the fundamental objective—that of pattern exposure. Factors such as stage movement, as well as a variety of distortion/aberration-inducing variations, may impose demands requiring adjustment in scanning. For example, embodiments entailing step-by-step exposure rather than continuous scanning, while in principle, requiring no beam scanning or even mechanical scanning, during exposure of a given region may use, likely slower, beam scanning during exposure of a region to e.g. expedite pattern stitching.

Illustrative Process Parameters

Process and apparatus are first discussed in terms of electron delineation—e.g. SCALPEL—for otherwise characteristic parameter values. To large extent, such values are determined by resist characteristics—primarily sensitivity—together with source brightness and lens power. Values discussed are commensurate with present state-of-the-art availability. Experimental verification relates to an individual scan of ±17 mrads (milliradians) or about ±1.0° defining a region dimension on the wafer of ∼±5 mm (or 10 mm). Providing for a dwell time of approximately 5 gsec (microseconds) results in exposure of a state-of-the-art chip pattern in "600 milliseconds (for a 40×40=1600 region pattern). Time values are those for total scanning-exposure—disregarding time devoted to any separate mechanical stage movement. As discussed, the relatively slow mechanical movement required to reposition as between scan areas of a given pattern, may be avoided under presently attainable conditions which provide for optical field values sufficient to accommodate a total chip pattern.

Fabrication of devices to the small design rules contemplated places large demands on precision. The inventive teaching, while most importantly responsive to such needs, requires relative freedom from distortion—e.g. from temperature-gradient induced distortion. At this time, region-by-region beam dwell time, as required for convenient resist/particle brightness, is found to result in rate or, alternatively, in yield-consequential mask distortion if uncompensated. An approach for alleviating this problem involves the more even heat distribution accompanying repeated region-by-region partial chip exposures, discussed above. Alternative, as well as supplemental cooling, is useful. Apparatus approaches to effectively accomplish the objective are known. Generally, it is sufficient to reduce temperature gradient-induced distortion to ∼20% of the design rule.

In summation, particularly for small chip patterns, delineation of the entirety of the pattern may entail but a single scanning step—but one optical field. Depending upon the size of the optical field, delineation of a chip pattern of size exceeding a single optical field may not require mechanical movement—may be accomplished with greater dependence on dynamic focusing. Under circumstances where such pattern is of area which exceeds the optical field, delineation requires mechanical movement as well as scanning. Required precision in alignment and registration under these circumstances is satisfied by accompanying field adjustment in positioning of the beam. In fact, mechanical movement, whether gradual or stepwise, is generally accompanied by field adjustment. In the instance of pattern-to-pattern, field adjustment in between independent patterns may be solely for assurance of registration relative to previous and sequential patterning levels.

As seen from the appended claims, the invention is properly described in terms of scan position-dependent angle of incidence as between delineating beam and wafer. As stated, the inventive approach contemplates two variations in angle of incidence—(1) a spatial variation, ray-to-ray, during instantaneous exposure, e.g. during exposure of a region between stepping for that mode of operation, and (2) a temporal variation, beam-to-beam, either stepwise or continuous in accordance with the particular inventive embodiment. Both variations are calculable based on source and processing characteristics. With regard to temporal variations, instantaneous angle of incidence values are calculable on the basis of the corresponding scan angle—the instantaneous angle by which the beam axis diverges from a reference (conveniently from the optic axis of the lens system). The illustrative extreme ray value of 1.3°, while representative of a useful embodiment, may vary in accordance with apparatus design/device design. For example, increasing column height, as well as larger design rules, may suggest a smaller range.

Relationship Between Parameters

For one angular value of the numerical aperture, $\Theta$, (as measured at the image plane—generally the plane of the wafer surface), depth of focus, D, of the system in vacuum is given by:

$$D = \pm \frac{\lambda}{8\sin^2 \frac{\theta}{2}}$$

where $\lambda$ is the equivalent deBroglie of the electron beam. For small values of $\Theta$ this approximates to, $$D = 0.5 \frac{\lambda}{\theta^2}$$

For one set of proposed conditions, $\Theta = 0.4$ mrad and $\lambda = 0.045$Å—a value corresponding with an accelerating voltage of 70 kV the numerical value for depth of focus, D, is ±14 μm, for a design under study, u=1200 mm, v=300 mm. For this example, and for an optical field of 1×1 cm², y=5 mm, the angle $\alpha$, the angle between the optical axis and the central ray of a bundle for this set of conditions may be determined from:

$$\tan\alpha = \frac{y}{v} = \frac{5}{300}$$

in which y is the linear distance between the pattern positions corresponding with the axial and extreme ray of a particular beam (or my bunch) so that $\alpha = 17$ mrad.

As indicated, small mechanical wafer movement is of little impact. Permitted registration error resulting from non-orthogonal illumination of the wafer may be calculated from the equation:

$$\Delta z = \pm \frac{x}{\tan \alpha}$$

in which:

$\Delta z$ = permitted variation in height, e.g. of the wafer surface x = permitted maximum registration error from this source.

For 0.15 μm design rule, the total overlay budget (the total permitted registration error) may correspond with the experimentally suitable 0.05 μm value. Assuming 0.025 μm error from this source, the permissible variation in height is:

$$\Delta z = \pm \frac{0.025}{0.017} = \pm 1.5 \ \mu m$$

I claim:

1. Method for fabrication of a device of feature size corresponding with design rule of a maximum of 0.5 μm, comprising at least one lithographic delineation step comprising illuminating a plurality of imaging regions of a mask by a beam of charged particles so that imaging information is imposed on such beam by passage through mask imaging regions so as to produce projected image on a device in fabrication, said particles emanating from a particle source and being accelerated to a velocity resulting in a deBroglie wavelength, $\lambda$, of a maximum value one order of magnitude smaller than the said design rule, characterized in that such beam as incident on such device is instantaneously constituted of particles on paths defining a range of directions so producing a corresponding spatial range of angles of incidence relative to the surface of such device, such angle of incidence varying spatially with reference to a reference position within such imaging region, and in which the beam position is changed so as to result both in a corresponding change in mask imaging regions illuminated and in projection imaging regions, wherein such change is accompanied by a temporal change of at least 0.1° in the angle of incidence of such beam.

2. Method of claim 1 in which included mask imaging regions together constitute a continuous pattern area larger than such individual imaging regions so that the projected image comprises a continuous pattern area larger than that of an individual region.

3. Method of claim 2 in which the angle of incidence of the beam is progressively varied in step fashion intermediate projection imaging regions.

4. Method of claim 2 in which the spatial range of angles of incidence for a single projection imaging region varies by an amount of at least 0.01°.

5. Method of claim 2 in which the temporal change in the angle of incidence is at least 0.1°.

6. Method of claim 5 in which the temporal change in the angle of incidence is at least 0.5°.

7. Method of claim 2 in which the charged particles consist essentially of electrons.

8. Method of claim 7 in which the accelerating field is of magnitude within the range of 50–200 kV.

9. Method of claim 8 in which the angle of incidence of the beam is continuously varied during projection of at least a portion of such projected image.

10. Method of any of claims 1 through 9 in which the design rule value of a maximum of 0.3 μm.

11. Method of any of claims 1 through 9 in which the design rule value is of a maximum of 0.2 μm.

12. Method of any of claims 1 through 9 in which mask imaging regions correspond with strut-supported mask segments.

* * * * *